United States Patent [19]
Gerstenhaber et al.

[11] Patent Number: 6,028,481
[45] Date of Patent: Feb. 22, 2000

[54] RAIL TO RAIL OUTPUT STAGE OF AN AMPLIFIER

[75] Inventors: Moshe Gerstenhaber, Newton; Scott C. Wurcer, Cambridge; Francisco José Carvalhão dos Santos, Arlington, all of Mass.

[73] Assignee: Analog Devices, Inc., Norwood, Mass.

[21] Appl. No.: 09/119,154

[22] Filed: Jul. 20, 1998

[51] Int. Cl.[7] .................................................. H03F 3/18
[52] U.S. Cl. .......................................... 330/263; 330/267
[58] Field of Search ..................................... 330/255, 263, 330/267

[56] References Cited

U.S. PATENT DOCUMENTS

| | | | |
|---|---|---|---|
| 4,135,162 | 1/1979 | Takahashi | 330/255 |
| 4,290,026 | 9/1981 | Shoji | 330/255 |
| 4,916,408 | 4/1990 | Stefani et al. | 330/255 |
| 5,440,273 | 8/1995 | Gusinov et al. | |
| 5,510,754 | 4/1996 | Moraveji et al. | 330/267 |

*Primary Examiner*—Benny T. Lee
*Assistant Examiner*—Henry Choe
*Attorney, Agent, or Firm*—Samuels, Gauthier & Stevens, LLP

[57] ABSTRACT

A gain stage is disclosed for use in an amplifier which provides an output signal. The gain stage includes a first transistor including a base, an emitter and a collector. The base is coupled to an input signal applied to the gain stage, and the emitter is coupled to a first source of operating potential. The gain stage also includes a second transistor including a base, an emitter and a collector. The collector of the second transistor is coupled to the collector of the first transistor for providing the output signal. The emitter of the second transistor is coupled to a second source of operating potential. The gain stage also includes a level shifter coupled to both the input signal and the base of the second transistor. The level shifter provides level shifting and produces a gain signal responsive to the input signal.

10 Claims, 1 Drawing Sheet

6,028,481

RAIL TO RAIL OUTPUT STAGE OF AN AMPLIFIER

BACKGROUND OF THE INVENTION

The invention relates generally to amplifiers, and particularly relates to a rail-to-rail output stage of an amplifier.

Amplifiers are ubiquitous in the electronics industry for both amplifying and buffering an input signal, as well as providing an output signal within a range of voltage or current (swing).

Of particular interest is to operate an amplifier with a maximum output swing between a given set of supplies. This function is referred to as rail-to-rail performance in accordance with the operation of the device between the positive and negative voltage supplies (or rails).

A conventional rail-to-rail gain stage of an amplifier is disclosed in U.S. Pat. No. 5,440,273, which discloses an operational amplifier with a rail-to-rail output stage. The '273 patent discloses an output (or gain) stage that includes a translinear bias voltage source, a voltage buffer and a pair of output transistors. Conventional output stages of amplifiers, however, continue to suffer from certain design constraints relating to output response performance, required power, output current sourcing and the number and size of components of the circuit, as well as frequency response and stability.

It is, therefore, an objective of the present invention to provide an output stage that is capable of low voltage operation.

It is also objective of the invention to provide an amplifier output stage that processes signals operating substantially near the power supply rails.

It is another objective of the invention to provide an output stage with a compact design having relatively few transistors.

It is further an objective of the invention to provide an output stage that has the ability to sink and source large currents while operating on a small bias voltage.

It is a further objective of the invention to reduce or eliminate the sensitivity of the quiescent current in an output stage to loading conditions on the output.

It is a further objective of the invention to reduce or eliminate the sensitivity of an output stage to variations in processing such as variations in resistor values or transistor matching during manufacturing.

SUMMARY OF THE INVENTION

The invention provides a gain stage for use in an amplifier, for receiving an input signal and for providing an output signal. A gain stage of the invention includes two output transistors for providing the output signal. Each output transistor is coupled to a different operating potential. A gain stage of the invention also includes a level shifter coupled to both the input signal and one of the two output transistors. The level shifter provides level shifting and produces a gain signal responsive to the input signal.

In various embodiments, the level shifter may include one or more differential pairs of transistors that are commonly coupled at their emitters. In further embodiments, the output stage may include one or more translinear bias voltage loops for maintaining steady state voltages at one or more transistors.

BRIEF DESCRIPTION OF THE DRAWING

The following detailed description of the illustrated embodiments may be further understood with reference to the accompanying drawings in which.

DETAILED DESCRIPTION OF THE ILLUSTRATED EMBODIMENTS

Figure 1:
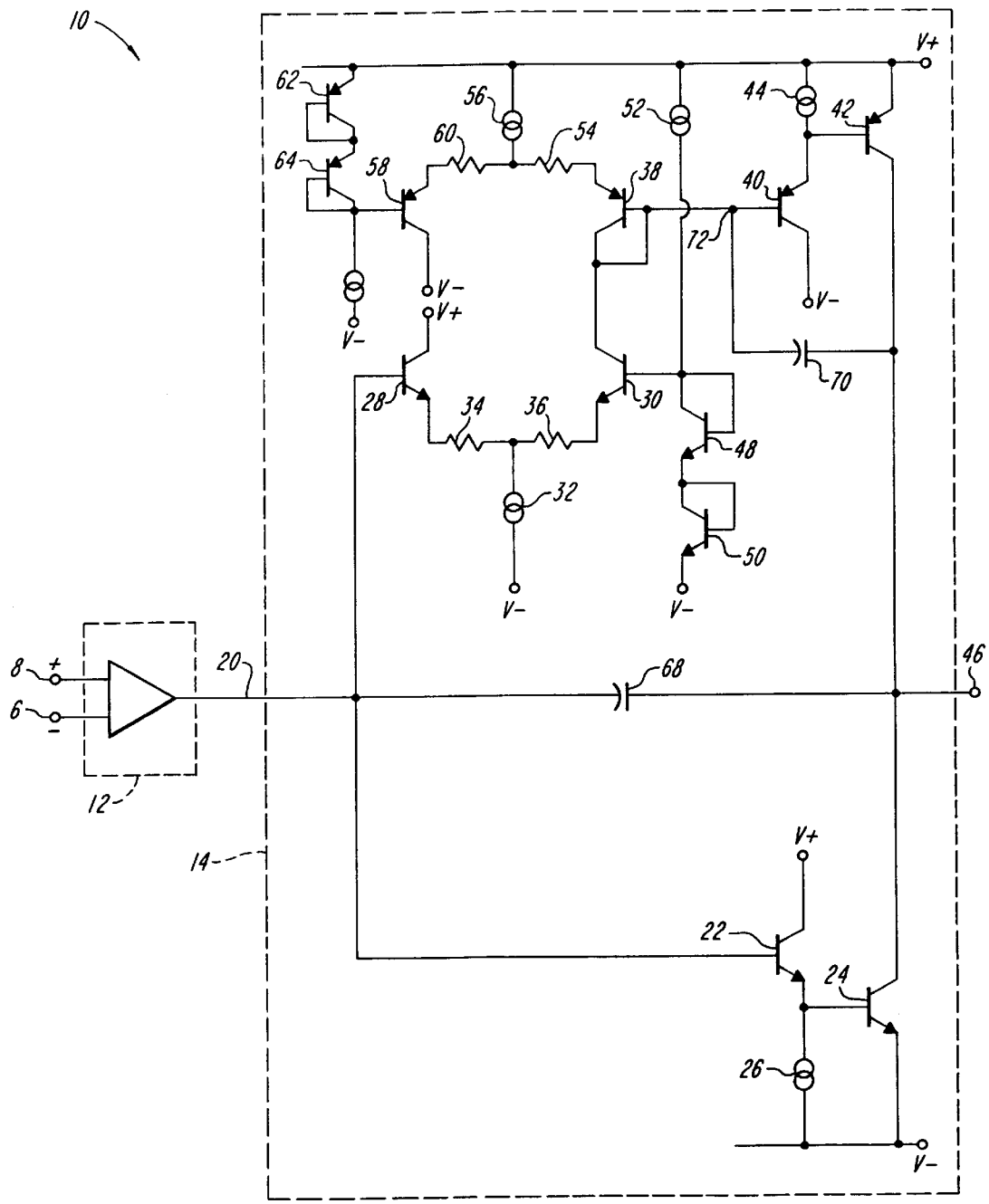
FIG. 1 is a block diagram including a circuit schematic for the output stage in accordance with an embodiment of the invention.

A circuit of the invention employs two integrator stages that operate differently. The integrator stages are controlled by a common bias control stage that is set outside of the feedback loop. One of the integrator stages is driven by a level shifting circuit that provides DC level shifting, while preserving the AC integrity of the input signal. There is a voltage gain of one across this level shifter for all frequencies of interest.

As shown in FIG. 1, an embodiment of an operational amplifier 10 of the invention includes an input stage 12 and an output stage 14. The input stage 12 is, for example, any gm stage taking differential input voltage across input nodes 16 and 18, and providing an output current that will drive the input node 20 of the output stage 14. It will be appreciated by those skilled in the art that the output stage 14 may be used as the output or gain stage of the amplifier 10, and that the output stage may be used in any amplifier circuitry. The output stage 14 is described herein as part of an operational amplifier for illustrative purposes only.

The output stage 14 is responsive to the current developed by the transconductance of the input stage 12 and delivered to node 20 for providing a rail-to-rail output signal for the operational amplifier 10. Node 20 is connected to the base of an NPN emitter follower transistor 22 that serves to drive the base of an NPN pull down transistor 24. The collector of the transistor 22 is connected to the positive voltage supply V+ or $V_{cc}$. The emitter of the transistor 22 is connected to the base of transistor 24, as well as a current source 26 that is connected to a negative voltage supply V− or $V_{EE}$.

The node 20 is also connected to a pair of NPN transistors 28 and 30 at the base of the first transistor 28. The emitters of the transistors 28 and 30 are commonly coupled to a current source 32, each via a resistor 34 and 36 respectively. In an exemplary embodiment, the resistors 34 and 36 may be, for example, each 500 ohms, and the current source 35 may provide 500 $\mu$A. The collector of transistor 28 is connected to the positive voltage supply $V_{CC}$, and the collector of the transistor 30 is connected to the collector of a PNP transistor 38. The base of transistor 38 is commonly connected to its own collector as well as the base of a PNP emitter follower 40. The collector of transistor 40 is connected to the negative voltage supply $V_{EE}$, and the emitter of the PNP transistor 40 is connected to the base of a PNP pull-up transistor 42. The emitter of transistor 40 is also coupled to the positive voltage supply $V_{CC}$ via a current source 44. The current source 44 may provide, for example, 463 $\mu$A. The emitter of transistor 42 is connected to the positive voltage supply $V_{CC}$, and the collector of transistor 42 is connected to the output signal node 46. The collector of the transistor 24 is also connected to the output node 46.

The base of transistor 30 is connected to a DC bias voltage that is provided by two NPN transistors 48 and 50 in series. Each transistor 48 and 50 is connected as a diode, and the pair are coupled to the voltage supplies $V_{EE}$ and $V_{CC}$. In particular, the base of transistor 30 is connected to the collector and base of transistor 48, and the emitter of transistor 48 is connected to the collector and base of transistor 50. The emitter of transistor 50 is connected to the negative voltage source $V_{EE}$. The base of transistor 30 is also connected to a current source 52, which in turn is connected to the positive voltage source $V_{CC}$. The current source 52 may provide, for example, 188 μA. The current source 52 and transistors 48 and 50 provide a DC bias voltage at the base of transistor 30 of about 2 $V_{be}$, above $V_{EE}$.

The emitter of transistor 38 is coupled to $V_{CC}$ via a resistor 54 in series with another current source 56. Another PNP transistor 58 matching the transistor 38 is also connected at its emitter to a resistor 60 is series with the current source 56. In an exemplary embodiment, the resistors 54 and 60 are each 500 ohms, and the current source 56 provides 500 μA. The collector of transistor 58 is connected to the negative voltage supply $V_{EE}$. The base of transistor 58 is connected to two PNP transistors 62 and 64 in series with another current source 66. In particular, the emitter of PNP transistor 62 is connected to $V_{CC}$, and the base and collector of transistor 62 is connected to the emitter of PNP transistor 64. The base and collector of transistor 64 are connected to the base of transistor 58 as well as to the current source 66, which is in turn connected to $V_{EE}$. The current source 66 provides a current of 176 μA in an exemplary embodiment. The transistors 62 and 64, as well as the current source 66 provide a DC bias voltage at the base of transistor 58 of about 2 $V_{be}$ below $V_{CC}$.

During use, at steady state, a translinear bias voltage loop is provided by transistors 22 and 24 together with transistors 48 and 50 connected to the respective bases of opposing transistors 28 and 30. The voltage at the base of transistor 30 is maintained at a level that permits the transistor 30 to be active at a particular portion of its active range. Similarly, the voltage at the base of transistor 58 is maintained at a level that permits the transistor 58 to be active at a particular portion of its active range.

Upon application of an input differential voltage at the input nodes 16 and 18, an input current is produced. This current is delivered to the bases of transistors 22 and 28, which raises or lowers the voltage at input node 20. In a further embodiment, a capacitor 68 is provided between the input node 20 and the output node 46 to integrate that current and produce an output voltage, as is conventionally known. A capacitor 70 is provided between the base of transistor 40 and the output node 46, which also acts as an integrator capacitor, and stabilizes the entire gain stage 14. In an exemplary embodiment, capacitor 68 is 1.25 pF, and capacitor 70 is 0.4 pF.

The voltage at node 20, which increases responsive to an input differential appearing at nodes 16 and 18, increases the voltage at the base of transistor 22. This permits more current to travel from the collector to the emitter of transistor 22, which in turn increases the current flow from the collector to the emitter of transistor 24. At the same time, the increase in the voltage at node 20 causes the voltage at the base of transistor 28 to increase. This causes the current through the resistor 34 to increase and the current through resistor 36 to decrease. The decrease in current from the emitter of transistor 30 causes the voltage at the collector of transistor 30 to increase. The voltage at both the base and collector of transistor 38 will also increase, as will the voltage at the base of transistor 40.

The regulated current flow from the current source 56, through the transistors 58, 38 and 30, provides that the voltage at node 72 will increase by the same amount that the voltage increased at node 20 responsive to the input signal. The voltage at the base of transistor 42 will also increase, causing a decrease in the amount of current flowing from the collector of the transistor 42 toward the output node. The net current flow at the output and into a load will equal the difference between the current flow of transistors 24 and 42. In an exemplary embodiment with a 1 K Ω load at the output, the output stage provides an inverted output with a gain of seventy.

The output circuit of the invention is capable of supplying large currents to a load, which may be connected at the output node 46, yet has small standby currents flowing if no input signal is applied. The circuit also provides current buffering at the output transistors. The NPN Darlington-connected transistors 22 and 24, together with the current source 26 provide output current buffering, as does the PNP Darlington-connected transistors 40 and 42, together with the current source 44. If a heavy load is applied to the output, then the voltage at node 20 will not drop significantly because of the current buffers.

The input voltage at the base of transistor 28 (as well as the voltage at the base of transistor 22) during steady state is governed by the translinear bias voltage loop (22, 24, 48, 50) and by the translinear bias voltage loop (40, 42, 62, 64). The voltage gain from node 20 to the base of transistor 42 is the same as the voltage gain from node 20 to the base of transistor 24, and equals one. The voltage change at the base of transistor 42 and at the base of transistor 24, is the same as the voltage change at node 20 when responding to changes in output current. None of the transistors shut off, ensuring that there is no loss of stability, and ensuring rapid settling of the amplifier under any conditions. This is because the input voltage at the base of transistor 28 (as well as the voltage at the base of transistor 22) is coupled to the base of one side of a differential transistor pair, while the output is coupled to the other side of the transistor pair, and the transistor pair forms a part of the translinear voltage loop.

Also, if the values of certain components vary, such as resistor values, or transistor pair mis-matching occurs, due to manufacturing inconsistencies (e.g., from silicon wafer variations), then the circuit will be relatively unaffected in performance. For example, if matched resistors 60 and 54 change with respect to matched resistors 34 and 36 during process manufacturing, then the quiescent output current does not change. Similarly, if all PNP transistor voltage-to-current characteristics change with respect to all NPN transistor voltage-to-current characteristics, then the quiescent output current does not change. This is due, in part, to the fact that the base voltage of an output transistor associated with each supply voltage is maintained in steady state by a different translinear bias voltage loop. Note that the steady state voltage at the base of transistor 40 is maintained by a second translinear voltage loop formed by transistors 40, 42, 62 and 64, connected to the respective bases of transistors 38 and 58 which form a differential pair.

Those skilled in the art will appreciate that modifications and variations may be made to the above disclosed embodiments without departing from the spirit and scope of the invention.

What is claimed is:

1. An output stage for use in an amplifier which provides an output signal, said output stage comprising:
   a first transistor including a base, an emitter and a collector, said base being coupled to an input signal applied to said output stage, and said emitter being coupled to a first source of operating potential;
   a second transistor including a base, an emitter and a collector, said collector being coupled to the collector of said first transistor for providing said output signal, said emitter being coupled to a second source of operating potential; and a level shifter for providing level shifting, said level shifter coupled to both the input signal and to said base of said second transistor, and including a first differential pair of transistors that are commonly coupled at their emitters to a first current source, and a second differential pair of transistors that are commonly coupled at their emitters to a second current source.

2. An output stage as claimed in claim 1, wherein a base of one of said first differential pair of transistors coupled to the input signal, and a base of the other of said first differential pair of transistors is coupled to a bias voltage.

3. An output stage as claimed in claim 1, wherein a collector of one of said first differential pair of transistors is coupled to a voltage source, and a collector of the other of said first differential pair of transistors is coupled to said second transistor.

4. An output stage as claimed in claim 1, wherein said output stage further includes a third output transistor associated with said first output transistor such that the base of said third output transistor is coupled to the input signal and the emitter of said third output transistor is coupled to said first output transistor.

5. An output stage as claimed in claim 4, wherein said output stage further includes a fourth output transistor associated with said second output transistor such that the base of said fourth output transistor is coupled to the level shifter and the emitter of said fourth output transistor is coupled to said second output transistor.

6. An output stage for use in an amplifier, said output stage for receiving an input signal and for providing an output signal, said output stage comprising:

first output means coupled to a first operating potential for receiving the input signal and for producing a first output signal;

second output means coupled to a second operating potential for receiving a level shifted signal and for producing a second output signal, the first output signal and the second output signal being coupled together forming the output signal of said output stage; and level shifter coupled to the input signal and said second output means, said level shifter for producing said level shifted signal, and including a first differential pair of transistors that are commonly coupled at their emitters to a first current source, and a second differential pair of transistors that are commonly coupled at their emitters to a second current source.

7. An output stage as claimed in claim 6, wherein a base of one of said first differential pair of transistors coupled to the input signal, and a base of the other of said first differential pair of transistors is coupled to a bias voltage.

8. An output stage as claimed in claim 6, wherein a collector of one of said first differential pair of transistors is coupled to a voltage source, and a collector of the other of said first differential pair of transistors is coupled to said second transistor.

9. An output stage as claimed in claim 6, wherein said first output means includes a first output transistor such that the base of said first output transistor is coupled to the input signal.

10. An output stage as claimed in claim 9, wherein said second output means includes a second output transistor such that the base of said second output transistor is coupled to the level shifter.

* * * * *